United States Patent [19]

Ozeryansky

[11] Patent Number: 5,127,149
[45] Date of Patent: Jul. 7, 1992

[54] METHOD OF PRODUCTION FOR MULTIFILAMENT NIOBIUM-TIN SUPERCONDUCTORS

[75] Inventor: Gennady Ozeryansky, Cheshire, Conn.

[73] Assignee: Advanced Superconductors, Inc., Waterbury, Conn.

[21] Appl. No.: 485,301

[22] Filed: Feb. 26, 1990

[51] Int. Cl.⁵ .............................................. H01L 39/24
[52] U.S. Cl. .................................. 29/599; 174/125.1; 505/884; 505/917
[58] Field of Search ....................... 29/599; 174/125.1; 505/889, 887, 917, 928, 930

[56] References Cited

U.S. PATENT DOCUMENTS

| | | | |
|---|---|---|---|
| 3,905,839 | 9/1975 | Hashimoto | 505/930 X |
| 3,958,327 | 5/1976 | Marawcik et al. | 29/599 |
| 3,996,661 | 12/1976 | Ziegler et al. | 29/599 |
| 4,224,735 | 9/1980 | Young et al. | 29/599 |
| 4,501,062 | 2/1985 | Hillmann et al. | 505/928 X |
| 4,665,611 | 5/1987 | Sadakata et al. | 29/599 |
| 4,752,654 | 6/1988 | Iida et al. | 29/599 X |

FOREIGN PATENT DOCUMENTS

| | | | |
|---|---|---|---|
| 55-010726 | 1/1980 | Japan | 174/125.1 |
| 56-162406 | 12/1981 | Japan | 174/125.1 |
| 63-276827 | 11/1988 | Japan | 29/599 |
| 2003766 | 3/1979 | United Kingdom | 29/599 |

Primary Examiner—Carl J. Arbes
Attorney, Agent, or Firm—Helfgott & Karas

[57] ABSTRACT

A process for producing a niobium-tin superconductor wire made from a multifilament composite via the internal tin approach is provided for. In particular, a process of preparing such a wire via an internal tin tube surrounded by a diffusion barrier and a stabilizer, this results in a drawn wire product have improved properties and lower cost.

3 Claims, 2 Drawing Sheets

METHOD OF PRODUCTION FOR MULTIFILAMENT NIOBIUM-TIN SUPERCONDUCTORS

FIELD OF THE INVENTION

This invention relates to niobium-tin superconductor wire made from a large number of intermetallic multifilaments and in particular to a method of production for such niobium-tin superconductors made via the internal tin approach using a tin tube source process which provides substantial advantages over the previously used tin core and bronze methods which have been employed heretofore.

BACKGROUND OF THE INVENTION

The field of superconductivity has been and continues to expand rapidly in no small part due to the discovery of various materials which retain superconductive properties at practical and useful high current levels, temperatures and external magnetic fields. Amongst such materials is niobium-tin ($Nb_3Sn$).

Various methods for manufacturing useful niobium-tin composite superconductors have been used in the art, see for example, Suenaga et al., U.S. Pat. No. 3,838,503 which issued on Oct. 1, 1974 and Young, et al., U.S. Pat. No. 4,224,735 which issued on Sep. 30, 1980, which provide a good summary of the various approaches taken in this art through that point in time.

More recently niobium-tin composite superconductors have been produced via what has become known as the internal tin approach, and more particularly via the internal tin core method. However, this approach suffers from various problems and limitations, not the least amongst which are its relatively high cost and various process limitations.

The tin core process involves first the manufacture of two major components—1) a composite element and, 2) a stabilizer tube. The composite tube is hot-extruded from a tubular billet, consisting of an array of niobium filaments in a cryogenic grade copper matrix. The tube is then filled with tin and drawn to a suitable size for restack. The drawing is done cold using conventional rod and wire drawing techniques. The resulting tin cored composite is referred to as the subelement. The stabilizer is also a tubular extrusion consisting of cryogenic grade copper with a thin diffusion barrier placed near the inside diameter of the tube. The subelement rods are assembled inside the tube and cold drawn to the appropriate size wire.

One of the problems of the tin core process is that it requires separate fabrication of two components. One of these components is a subelement, which is then utilized with the other component. The fabrication of such subelements is time-consuming and expensive. Additionally, the surface of a subelement often gets contaminated with inclusions which can be detrimental for a wire drawability and future magnet performance.

Further problems concern the drawability of the loose bundle of subelements. If instead of using pure Nb, the Nb is alloyed, it becomes very difficult to draw the subelements.

Accordingly, it would be desirable to come up with a practical way of forming multifilament intermetallic niobium-tin wire without using the tin core process.

An alternate suggestion in formation of such wire is presented in U.S. Pat. No. 4,224,735. This patent suggests utilizing concentric alternating annular layers of tin and copper. This invention applies a tin ring to substitute a bronze in a manner similar to mechanical alloying. Each filament has several layers of tin and copper of its own. That approach is extremely complicated, expensive, and most importantly, has very poor drawability.

SUMMARY OF THE INVENTION

Accordingly, it is an object of the present invention to prepare a niobium-tin superconductor wire fabricated with a large number of filaments at lower cost than has been heretofore possible.

A further object of the present invention is to provide a process for preparing a niobium-tin superconductor wire including a large number of filaments which does not suffer from the problems and process limitations encountered using the internal tin core and bronze approaches.

Another object of the present invention is to provide a process for fabricating a niobium-tin superconductor wire with a large number of filaments which allows for the production of such superconductor wire in uninterrupted lengths larger than heretofore made possible by the methods taught in the prior art.

A further object to the present invention is to provide a multifilament niobium-tin superconductor wire which will have the ability of a higher current carrying capacity and will permit fewer damaged wires and losses resulting therefrom.

Briefly, the present invention involves changing the geometry of the tin source and eliminating the complexity of multiple bundling of the composite subelements associated with the conventional internal tin core process. The method comprises the formation of a conductor which consists of a single solid Cu/Nb composite core surrounded by a tin tube and a concentric shell of stabilizing copper separated by a diffusion barrier. Since the source of tin for the $Nb_3Sn$ reaction is a tube, the process is conveniently called the tin-tube source (TTS) method. First, a solid composite containing filaments of Nb (or its alloy) in a copper matrix is produced. This rod which can be produced by conventional and routine manufacturing methods is inserted into a tin tube or wrapped within a tin strip. The assembly is then placed inside a stabilizer tube and cold drawn to final wire size.

The aforementioned objects, features and advantages of the invention will, in part, be pointed out with particularity, and will, in part, become obvious from the following more detailed description of the invention, taken in conjunction with the accompanying drawing which forms an integral part thereof.

BRIEF DESCRIPTION OF THE DRAWINGS

In the drawing.

In the various figures of the drawing like reference characters designate like parts.

DESCRIPTION OF THE PREFERRED EMBODIMENTS

Interest in the internal tin approach for fabricating niobium-tin superconductor wire has been increasing. The present invention offers an improved process for preparing such niobium-tin superconductor at greatly reduced cost and with better overall properties.

The internal tin tube source process (TTS) of the present invention offers the following advantages over the internal tin core process (TCP):

1. A conductor cost reduction of at least 30%.
2. Excellent drawing properties and low strain sensitivity at drawing.
3. Overall improvement of quality of the finished wire.
4. Higher current density—Jc.
5. Less strain sensitivity of reacted conductor.
6. Lower A.C. losses due to the absence of distortions.
7. At least 10 weeks reduction of production cycle, resulting in lower labor and costs.

More particularly, the tin tube process (TTS) of the present invention does not require composite rod drawing, to small restack diameters and fabrication of numerous subelements, which the TCP process always has.

Figure 1:
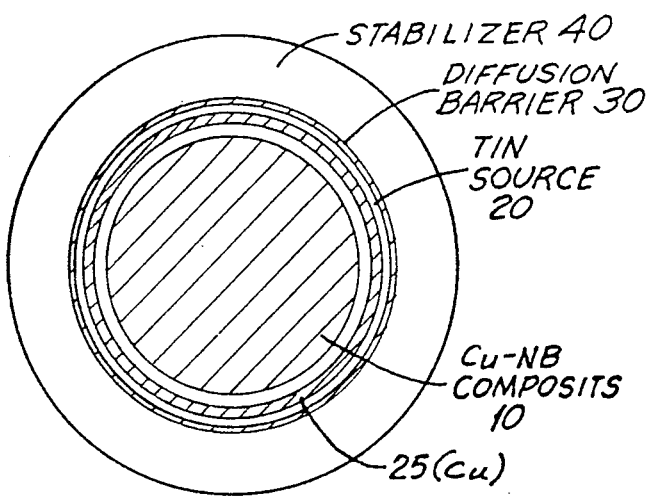
FIG. 1 shows a representation of a cross-section of a wire of the present invention showing the various layers of copper-niobium composite, tin ring, diffusion barrier and stabilizer, all prior to treating.

Referring now to FIG. 1, there is shown a preferred embodiment of the present invention wherein a copper Cu-Nb composite 10 is shown encircled within a tube of tin 20 which serves as a tin source. The composite is encased in a diffusion barrier 30 which separates the tin layer and composite from the copper stabilizer 40. Preferably, an additional layer of copper 25 is provided between the tin tube 20 and the diffusion barrier 30.

The particular assembly is formed by first forming the Cu-Nb composite which can be formed in a conventional manner. Thus, a billet of Nb rods are provided within a copper matrix to provide a multifilament billet. This is extruded in a known manner to form the Cu-Nb composite.

The composite core is then surrounded by a tin tube and a concentric shell of stabilizing copper separated by a diffusion barrier. Since the source of tin for the ultimate reaction in forming the $Nb_3Sn$ reaction is the tin tube, the process is referred to as the tin tube source.

Figure 7:
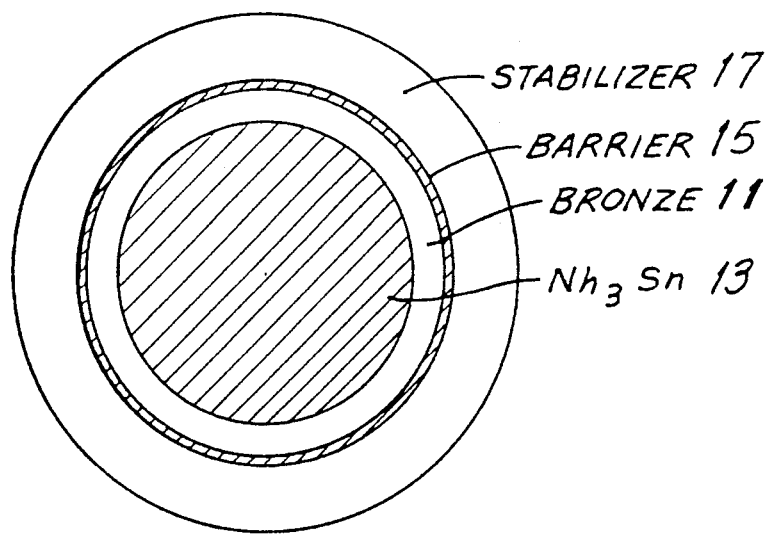
FIG. 7 shows a schematic representation of a cross-section of the final wire after heat-treated and wire processed wherein the niobium-tin semiconductor wires have been formed.

After the assembly shown in FIG. 1 is formed, it is cold drawn to a final wire size. Thereafter, the wire is distributed to users who will then wind the wire in the necessary magnets, or the like, and provide the necessary heat treatment and wire processing. During such heat treatment, the tin from the tube will diffuse into the materials to provide a final wire, as shown in FIG. 7. Specifically; the tin from the tin source diffuses into the copper to provide the bronze 11, and the tin react with the niobium rods to provide the $Nb_3Sn$ filaments 13. The result will be a multifilament niobium-tin wire embedded within a bronze matrix. The barrier 15 remains separating the wire from the outer stabilizer 17.

As is shown in FIG. 1, preferably an additional layer of copper 25 is included between the tin source 20 and the diffusion barrier 30. This serves to prevent the contact and penetration of the tin source into the diffusion barrier. The diffusion barrier may typically be niobium or tantalum, or the like. By using the additional copper layer 25 it prevents the contact of the tin with diffusion barrier.

It will also be noted in FIG. 7, that the presence of the tin source 20 disappears through the diffusion process. However, the space occupied by the tin is converted into bronze material to effectively provide a bronze ring around the multifilament niobium-tin wire. This bronze ring that results in the wire provides a further reduction of losses in the multifilament wires.

Figure 8:
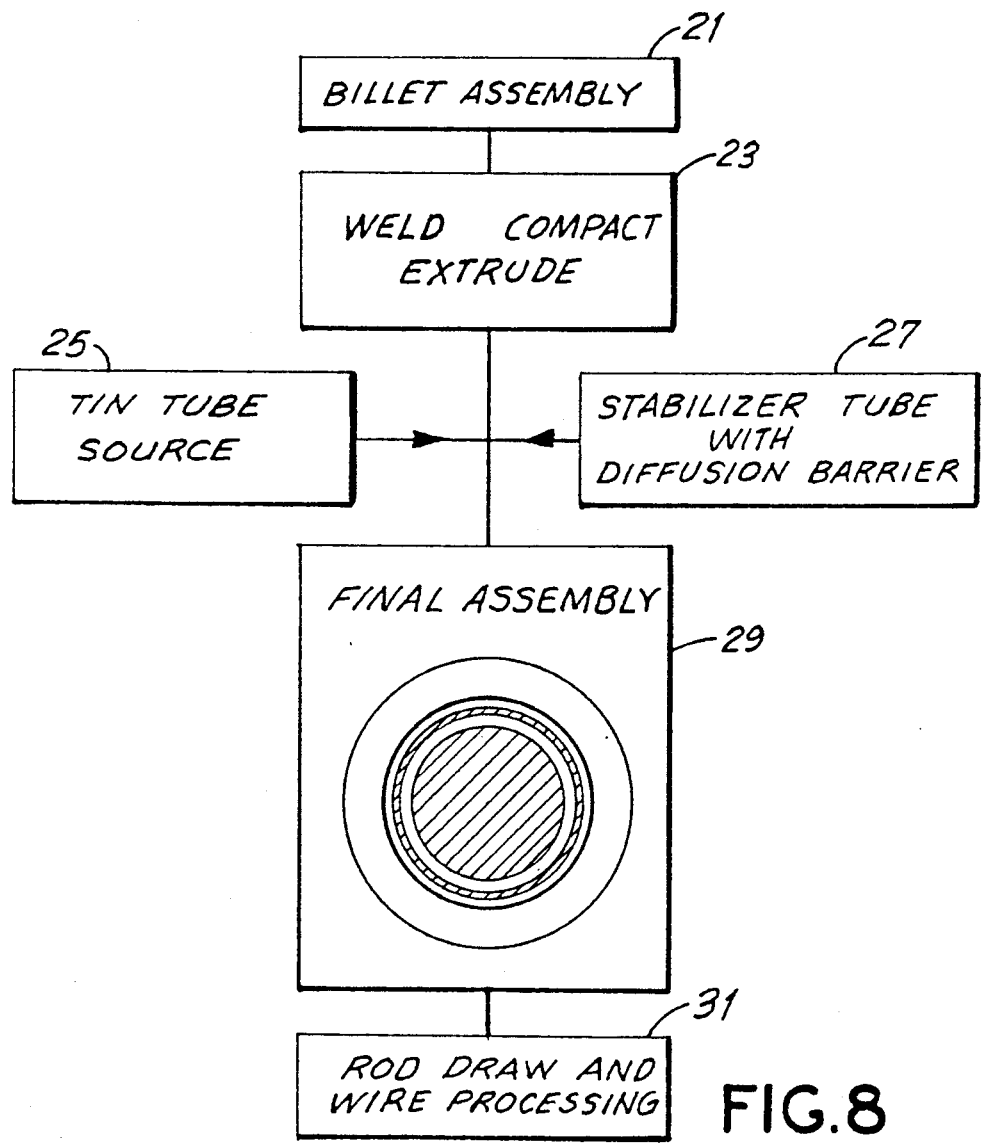
FIG. 8 is a flow chart showing the various steps involved in the tin tube source process of the present invention.

A summary of the steps involved in the tin tube source process described in now shown in FIG. 8. Initially, a billet assembly is provided as shown in Step 21. The billet assembly is a multifilament series of niobium wires within a composite matrix to form the composite Cu-Nb billet.

The billet is then welded, compacted and extruded, as shown in Step 23. A tin tube source 25 is then provided with a stabilizer tube and diffusion barrier therearound, as shown at 27 to provide the final assembly 29. The ultimate wire is then drawn and proceeded through wire processing as shown at 31.

Figure 2:
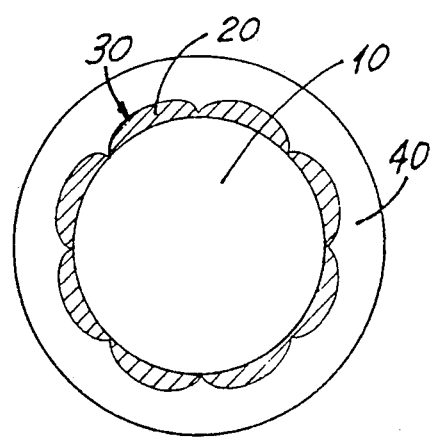
FIG. 2 shows a schematic representation of a cross-section of another embodiment of the present invention, showing the same layers as shown in FIG. 1, wherein the stabilizer layer is finned.

As a result of the heat treatment operations that are generally performed by the customer purchasing the wire, the tin tube melts and there may be a tendency of the center composite to be slightly displaced off center. This is especially the case for large wires, especially for cores larger than 0.010". In order to prevent off-centered displacement, it is possible to provide fins within the assembly to maintain the core properly situated within the wire. Examples of this are shown hereafter in FIGS. 2-5:

As shown in FIG. 2, the stabilizer layer 40 is provided with fins, to enhance the drawing characteristic and prevent channeling of the tin layer, thus enhancing the overall homogeneity of the finished product.

Figure 3:
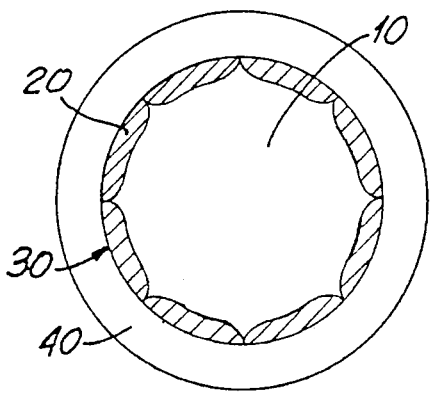
FIG. 3 shows a schematic representation of a cross-section of another embodiment of the present invention, showing the same layers as shown in FIG. 1, wherein the copper-niobium composite is finned.

In yet another embodiment of the present invention which is shown in FIG. 3, the composite layer 10 is shown with fins, which protrude into the tin layer, also to prevent channeling and to enhance overall homogeneity of the finished product after drawing.

Figure 4:
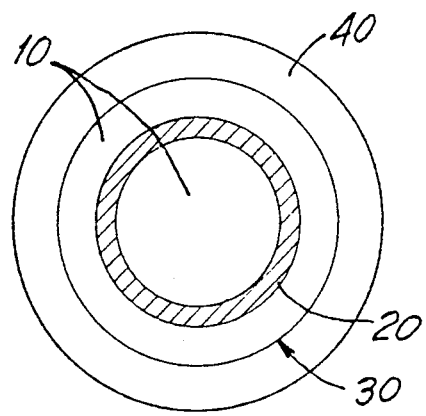
FIG. 4 shows a schematic representation of a cross-section of yet another embodiment of the present invention, showing an additional copper-niobium composite layer between the tin layer and the diffusion barrier.

In a further embodiment of the present invention, shown in FIG. 4, the tin layer 20 is surrounded on both sides by Cu-Nb composite 10, prior to being encased in the diffusion barrier 30 and the stabilizer layer 40.

Figure 5:
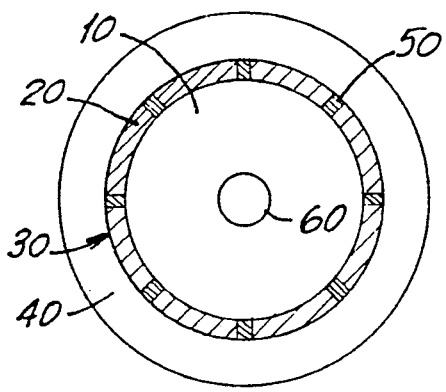
FIG. 5 shows a schematic representation of a cross-section of another embodiment of the present invention, showing the addition of space elements to the tin layer and the insertion of a tin core.

An alternative preferred embodiment of the present invention is shown in FIG. 5, wherein the tin layer 10 is provided with spacers 50, also to reduce channeling and to effect an overall improvement in homogeneity of the finished product after drawing. In the embodiment of FIG. 5, the Cu-Nb composite is also provided with a separate additional tin core 60, which serves to provide an additional source of tin and thus add a further enhancement to the ability of the process to achieve good homogeneity.

Figure 6:
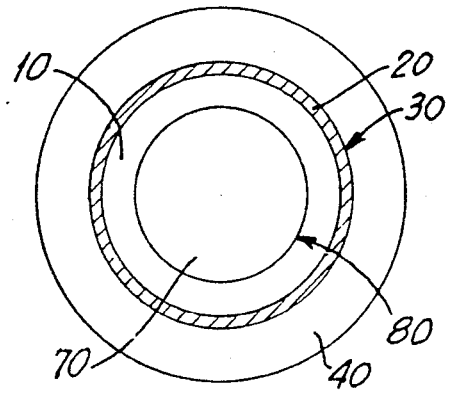
FIG. 6 shows a schematic representation of a cross-section of another embodiment of the present invention, showing the addition of a stabilizer core, and a second diffusion barrier.

A further alternative preferred embodiment of the present invention is shown in FIG. 6, which provides an additional copper core stabilizer 70 in addition to the outer copper stabilizer layer 40, as well as a diffusion barrier 80, in addition to the outer diffusion barrier 30.

In carrying out the process of the present invention, the diffusion barrier layer will preferentially be a material selected from the group comprising Nb, Ta, Ti, V or Zr and, more preferably, will be Nb.

It should also be appreciated, that the initial niobium rods could be alloyed with any of the following: Ti, Ta, Hf, Zr, or others as is well known. Furthermore, it could be alloyed with more than one of the above. Likewise, the copper matrix could be alloyed with small amounts of any of the following, either alone or in combination, as is well known in the arts: Sn, In, Ga, Zn, $Al_2O_3$, Mg, Be, Ti, or Mn.

In the preferred embodiment of the present invention the control tin ring will be from approximately 5 $\mu$m to approximately 80 $\mu$m in thickness. More preferably, this thickness of the tin ring will vary from about 10 $\mu$m to about 50 $\mu$m in thickness.

The tin source process of the present invention appears to have the following advantages over the internal tin core method:

1) Solid Cu/Nb composite rods are easier to produce than tubular elements. Billet assembly, welding, compaction, and extrusion are all vastly simplified.
2) Since inclusions which are a major source for wire breaks could be lodged on the inside surface of tubular composite, the question of their removal does not come into picture in solid extrusions.
3) The filament roundness and uniformity along the length can be better maintained in solid extrusions than in tubular ones and without elaborate special tooling.
4) Composite drawability can be greatly improved in the TTS process since only one concentric core element is involved as opposed to a loose pack of multiple elements in the tin core approach.
5) As far as the tin diffusion is concerned the TTS conductor appears to be more favorable due to a large contact area between tin and copper and to the fact that a larger fraction of the Nb filaments are located near the perimeter of the core than on the inside.
6) Larger amounts of Nb can be incorporated due to a better use of the available space. By eliminating some of the "dead" copper (near the tin core) and reducing the local ratio, (since the filament distortion is virtually absent), one can anticipate an increased Jc by 10–20% in TTS conductors.
7) The strain tolerance of the reacted conductors due bending is also expected to be improved because a sizeable fraction of the filaments are arranged near the neutral axis of the wire.

The tin tube process of the present invention also increases productivity at final drawing, in that the elimination of subelements will eliminate bonding problems and thus will serve to increase productivity at final drawing.

The tin tube source process opens vast new horizons for $Nb_3Sn$ by allowing the use of alloys which were out of the question when using TCP or the bronze process due to their high strength and high rate of strain hardening.

Solid composite for the tin tube process could be extruded in any size, even 12" diameter if necessary thus substantially cutting extrusion and assembly cost. The tubular composite for TCP is very difficult to extrude from billets larger than 8" diameter.

The composite rod drawing operation is, practically speaking, the most hazardous in terms of quality. The rod could crack and the surface of the rod can pick up particles (and always does). Elimination of the rod drawing operation using the present process enormously reduces those hazards which lead to yield loss and increases labor cost due to the wire breaks.

For the tin tube conductor, diffusion distances in the tin source will be smaller or the same as in the best tin core conductors. Due to the fact that the tin source is located around the copper shell, there will always be plenty of copper available to accommodate the tin and reduce the concentration gradient thus reducing void formation. Further void formation also has to be moderated by local copper. 75% of local copper is located in approximately half the distance from the tin tube to the center wire.

In the tin tube approach, the tin will have to diffuse through greater distances than in the tin core approach, but the vastly different geometry of the diffusion process, leads to a reduction not an increase in homogenization time.

Jc increase of at least 10% can be expected due to the absence of the inner tube which usually occupies 10% of the cross section of the composite. The more uniform reaction which results also could lead to a gain in current density.

Solid State Diffusion is visible for small strands of the tin tube conductor due to the fact that the thickness of the tin tube wall could be under 15 $\mu$k.

In the tin tube process of the present invention the tin, copper shell and spacers occupy up to 40% of the conductor non-copper cross section. In other words, in the tin ring conductor, the superconductor is concentrated towards the center of the cross section. Simple calculations show that up to 22.5% less strain results due to this factor.

The necessity for tubular extrusion and restack drawing with the TCP approach causes filament and pattern distortions in the tin core conductor. Tin tube conductor is free from such distortions and will thus display superior loss properties.

Example: If 0.032" diameter conductor is made by tin source process this conductor will have approximately 27 $\mu$m thickness of tin tube wall and will easily exceed required specifications across the board with expected average length achieved in the tens of thousands feet. A tin core approach would require a 55 $\mu$m core size.

While particular embodiments of the present invention have been shown, it will be obvious to those skilled in the art that changes and modifications may be made without departing from the invention in its broader aspects. Therefore, the aim in the appended claims is to cover all such changes and modifications within the true spirit and scope of the invention. The matter set forth in the foregoing description and drawings is offered by way of illustration only and should not be considered as limiting the invention in any way whatsoever. The actual scope of the invention is intended to be defined in the following claims, when viewed in their proper perspective based on the prior art.

I claim:

1. A process for preparing a superconductor wire, comprising the steps of:

forming a single solid copper-niobium composite core by assembling a multifilament billet from Nb rods within a copper matrix and extruding said multifilament billet;

providing a tin tube;

providing a stabilizer material tube;

encasing said composite core in said tin tube to form a tin encased composite core;

surrounding said tin encased composite core with a thin diffusion barrier layer;

concentrically surrounding said composite core having a thin diffusion barrier layer thereon with said stabilizer material tube to provide an assembled product; and cold drawing said assembled product to a final wire size;

wherein the composite core is assembled around a smaller core of tin.

2. A process for preparing a superconductor wire, comprising the steps of:

forming a single solid copper-niobium composite core by assembling a multifilament billet from Nb rods within a copper matrix and extruding said multifilament billet;

providing a tin tube;

providing a stabilizer material tube;

encasing said composite core in said tin tube to form a tin encased composite core;

surrounding said tin encased composite core with a thin diffusion barrier layer;

concentrically surrounding said composite core having a thin diffusion barrier layer thereon with said stabilizer material tube to provide an assembled product; and cold drawing said assembled product to a final wire size, wherein the composite core is assembled around a smaller core of stabilizer material of like kind to the material of said stabilizer material tube.

3. A process according to claim 2 wherein an inner core of stabilizer material is provided with a diffusion barrier between it and the composite core.

* * * * *